US006580937B2

(12) United States Patent
Ho et al.

(10) Patent No.: US 6,580,937 B2
(45) Date of Patent: Jun. 17, 2003

(54) METHOD FOR OPTIMAL IMAGING OF THE PERIPHERAL VASCULATURE EMPHASIZING DISTAL ARTERIAL VISUALIZATION IN A MULTI-STATION EXAMINATION

(75) Inventors: Vincent B. Ho, North Bethesda, MD (US); Thomas K. F. Foo, Rockville, MD (US)

(73) Assignees: GE Medical Systems Global Technology Co., LLC, Wakesha, WI (US); Uniformed Services University of Health Sciences, Department of Defense, United States Government, Bethesda, MD (US)

( * ) Notice: Subject to any disclaimer, the term of this patent is extended or adjusted under 35 U.S.C. 154(b) by 101 days.

(21) Appl. No.: 09/681,092

(22) Filed: Dec. 30, 2000

(65) Prior Publication Data

US 2002/0087069 A1 Jul. 4, 2002

(51) Int. Cl.[7] .................................................. A61B 5/05
(52) U.S. Cl. ....................................... 600/415; 600/420
(58) Field of Search ................................. 600/415, 410, 600/419, 420; 324/306, 309, 318, 307

(56) References Cited

U.S. PATENT DOCUMENTS 5,924,987 A * 7/1999 Meaney et al. ............. 600/420
6,073,042 A * 6/2000 Simonetti .................... 600/420
6,122,539 A * 9/2000 Figueira et al. ............. 600/411
6,240,310 B1 * 5/2001 Bundy et al. ............... 600/420
6,249,694 B1 * 6/2001 Foo et al. .................... 600/420

OTHER PUBLICATIONS

US 6,135,954, 10/2000, Foo et al. (withdrawn)
Ho KY, Leiner T, de Haan MW, Kessels AG, Kitslaar PJ, and van Engelshoven JM. Peripheral vascular tree stenoses: evaluation with moving–bed infusion–tracking MR angiography. Radiology 1998; 683–92.

(List continued on next page.)

Primary Examiner—Quang T. Van
(74) Attorney, Agent, or Firm—Ziolkowski Patent Solutions Group, LLC; Michael A. Della Penna; Carl B. Horton

(57) ABSTRACT

A method and apparatus are disclosed for creating peripheral MR angiographic images and performing an MRA examination using an intravascular contrast agent in which MR data acquisition is optimized in the most distal stations in a multi-station acquisition. The technique includes administering a contrast agent into the blood stream of the patient, acquiring low spatial resolution MR images of the arterial vasculature, and tracking the passage of the contrast agent through the patient. The patient table is moved in response to the tracking. The technique continues to acquire low spatial resolution images at each of the proximal stations until the most distal station is reached where a high spatial resolution image data set is then acquired of preferentially arterial vascular structures. Higher spatial resolution images are then acquired in the proximal stations.

27 Claims, 6 Drawing Sheets

OTHER PUBLICATIONS

Ho VB and Foo TK. Optimization of gadoliniun–enhanced magnetic resonance angiography using an automated bolus–detection algorithm (MR SmartPrep). Original investigation. Invest Radiol 1998; 33: 515–23.

Earls JP, DeSena S, and Bluemke DA. Gadolinium–enhanced three–dimensional MR angiography of the entire aorta and iliac arteries with dynamic manual table translation. Radiology 1998; 209: 844–9.

Ho KY, Leiner T, and van Engelshoven JM. MR angiography of run–off vessels. Eur Radiol 1999; 9: 1285–9.

Meaney JF, Ridgway JP, Chakraverty S, Robertson I, Kessel D, Radjenovic A, Kouwenhoven M, Kassner A, and Smith MA. Stepping–table gadolinium–enhanced digital subtraction MR angiography of the aorta and lower extremity arteries: preliminary experience. Radiology 1999; 211: 59–67.

Wilman AH, Riederer SJ, Huston J $3^{rd}$, Wald JT, and Debbins JP. Arterial phase carotid and vertebral artery imaging in 3D contrast–enhanced MR angiography by combining fluoroscopic triggering with an elliptical centric acquisition order. Magn Reson Med 1998; 40: 24–35.

* cited by examiner

METHOD FOR OPTIMAL IMAGING OF THE PERIPHERAL VASCULATURE EMPHASIZING DISTAL ARTERIAL VISUALIZATION IN A MULTI-STATION EXAMINATION

BACKGROUND OF INVENTION

The present invention relates generally to magnetic resonance imaging (MRI) technology, and more particularly, to an apparatus and method to optimize imaging of the peripheral vasculature.

Arteries are the blood vessels emanating from the heart that supply the necessary nutrients to the organs and tissues of the human body. A narrowing or constriction of an artery reduces the delivery of nutrients, such as oxygen to the recipient tissue and has profound effects on tissue function. In general, significant narrowing of an artery leads to compromised function of the organ in question, at best, and organ failure or death at worst. Stenosis or narrowing at any number of locations along the course of the arteries from the abdominal aorta through the calf can result in compromise of arterial blood flow to the distal lower extremities. The evaluation of the peripheral vessels is further complicated by the high incidence of tandem or synchronous lesions, any one of which could be the underlying cause for diminished arterial blood flow. Furthermore, the surgical decisions for potential bypass procedures to improve distal blood flow are greatly affected by the ability to assess the arteries in the foot. As a result, the successful imaging of the lower extremities (i.e. the peripheral run-off study) requires not only the accurate assessment of the presence and functional significance of a narrowing, but also the ability to evaluate the entire arterial course of the peripheral arterial tree from abdominal aorta to the foot.

There are many techniques available for the assessment of the peripheral arteries that include traditional invasive catheter angiography and ultrasound. Because conventional x-ray angiography requires catheterization and the use of nephrotoxic iodinated contrast agents, it is reserved as the final option. Screening for peripheral arterial occlusive disease (PAOD) is typically performed using non-invasive methods such as ultrasound or plethysmography. However, neither of these techniques can provide angiographic illustration of the vessels and merely provides the assessment of individual segments of the intervening arterial anatomy. Both techniques are operator dependent and have confounding technical difficulties which make the imaging often tedious to perform. Moreover, neither technique can provide the comprehensive information required for surgical planning and traditional x-ray angiographic depiction is generally required as an adjunct for pre-operative management.

Magnetic resonance imaging is a method for the non-invasive assessment of arteries. MRI utilizes radio frequency pulses and magnetic field gradients applied to a subject in a strong magnetic field to produce viewable images. When a substance containing nuclei with net nuclear magnetic moment, such as the protons in human tissue, is subjected to a uniform magnetic field (polarizing field $B_0$), the individual magnetic moments of the spins in the tissue attempt to align with this polarizing field (assumed to be in the z-direction), but precess about the direction of this magnetic field at a characteristic frequency known as the Larmor frequency. If the substance, or tissue, is subjected to a time-varying magnetic field (excitation field $B_1$) applied at a frequency equal to the Larmor frequency, the net aligned moment, or "longitudinal magnetization", $M_z$, may be nutated, or "tipped", into the x-y plane to produce a net transverse magnetic moment $M_t$. A signal is emitted by the excited spins after the excitation signal $B_1$ is terminated (as the excited spins decays to the ground state) and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting MR signals are digitized and processed to reconstruct the image using one of many well-known reconstruction techniques.

The imaging of blood vessels using MRI, or magnetic resonance angiography (MRA), is an emerging method rapidly supplanting other non-invasive methods for arterial illustration. Until recently, the application of MRA has been tailored to individual smaller vascular territories (40–50 cm fields of view). With the ability now to translate the table and to image several overlapping fields-of-view or "stations" in rapid succession, MRA can now be used with a bolus chasing technique and result in the imaging of a much larger anatomic length, as necessary for evaluation of PAOD. The rapid performance of multiple MRA acquisitions in sequential and contiguous fashion during the arterial passage of a contrast agent down the lower extremities can yield the depiction of 1–1.2 meters of arterial anatomy. This technique called bolus chase peripheral MRA typically requires 1–2 minutes and utilizes an intravenously administered contrast agent, typically an extra-cellular Gadolinium (Gd)-chelate contrast agent.

This technique relies on the ability to coordinate the acquisition of image data (i.e. the MRA scan) with peak arterial concentration of the contrast bolus that typically occurs during the initial arterial phase of the contrast bolus (i.e., first pass acquisition). Poor coordination of image acquisition (i.e. poor timing) will result in insufficient arterial signal and poor arterial illustration. If imaging is performed late, there can be significant venous and background tissue enhancement that will also diminish the conspicuity of the arterial structures that are already faint secondary to lowered contrast agent concentration.

The typical bolus chase MRA starts in the mid-abdomen and includes the pelvis and extends to the ankle and feet. Timing is typically predicated by the contrast arrival in the initial station (i.e. abdominal aorta) with subsequent imaging performed in automatic sequential "rapid-fire" fashion. Thus, the primary imaging target is the abdominal aorta (i.e. proximal station) and this technique assumes that the speed of imaging alone will allow preferential arterial depiction of all subsequent imaging stations (e.g. thigh, calf and foot). This has been shown to work sufficiently for imaging the peripheral arterial tree above the knee using traditional extra-cellular contrast agents injected at a relatively slow rate, such as in the range of 0.3–1.0 mL/sec. The disadvantage of using a slow infusion rate is that the maximum achievable arterial concentration of contrast agent is markedly diminished and arterial enhancement is often insufficient for reliable depiction of smaller vessels of the infrapopliteal (below the knee) peripheral arterial tree.

Unlike traditional extracellular Gd-chelate contrast agents, intravascular contrast agents persist within the vasculature much longer secondary to their diminished leakage out of the vessels. These contrast agents, therefore, provide an improved opportunity to illustrate vascular structures by maintaining a reliably high concentration of contrast agent within the arteries for an extended period of time, thus providing a prolonged arterial phase or period of arterial enhancement. However, venous enhancement is also prolonged and can significantly diminish the conspicuity of adjacent arterial structures. Moreover, in using intravascular contrast agents, venous signal enhancement has an even higher likelihood as there is less dispersion of the contrast bolus into the peripheral tissue extra-cellular space. Therefore, in order to image the entire length of the peripheral vasculature using intravascular contrast agents, venous contamination is a much larger concern than when extra-cellular agents are used since the venous signal can be significant and more persistent. Furthermore, venous contamination is most noticeable in the distal extremities where the arteries are relatively much smaller and fewer in number than their associated venous structures. For example, arterial depiction in the foot and calf can be profoundly complicated by venous overlap when using intravascular contrast agents for peripheral MRA.

It would therefore be advantageous to develop a multi-station data acquisition technique to image the peripheral vasculature in which the distal arteries are well depicted, but at the same time acquiring MR data that is sufficient to reconstruct images to visualize the remaining proximal arterial structures.

SUMMARY OF INVENTION

The present invention relates to a method and apparatus for optimal imaging of the peripheral vasculature using a contrast agent to emphasize distal arterial visualization during a multi-station examination using MR technology that solves the aforementioned problems.

The invention includes a technique in which data is acquired rapidly in the proximal stations of a multi-station acquisition. The data is acquired with a low resolution acquisition scheme in order to image the most distal station at the optimal arrival time of a contrast bolus. Since the most distal station is the primary imaging target for this particular arterial phase imaging, the data acquired in the distal station is acquired with a high spatial resolution on the first pass of the contrast bolus and at the optimal arrival time of the contrast bolus. The secondary imaging targets of the arterial phase pass of the contrast bolus are the more proximal stations where low resolution images can be acquired with a moving table scheme to chase the bolus to the most distal stations. In this technique the acquisition time for the more proximal stations that include the abdomen, pelvis, and thigh, are chosen to avoid compromising the arterial phase contrast enchancement of the most distal station which can include the lower extremity below the knee or the upper extremities below the elbow. Once the distal station examination is complete, the patient is moved such that higher spatial resolution images at the more proximal stations can be acquired. In this manner, high spatial resolution data from the proximal stations from a subsequent acquisition can either be combined with that from the initial (first pass or arterial phase) acquisitions, or the data from the first pass acquisition can be used to segment out the arterial structures in these proximal stations. This method is well suited, but not limited, to use with intravascular contrast agents that have prolongation of high arterial and venous signal.

The invention includes a method of peripheral vasculature imaging that includes first administering a contrast agent into a blood stream of a patient, then acquiring low spatial resolution MR images of an arterial vasculature of the patient when positioned in a proximal station, and then moving the patient from the proximal station to a distal station. MR data of an extremity of the patient is then acquired at the distal station that is sufficient to reconstruct a high resolution image to visualize arterial structure in the extremity of the patient. The method next includes moving the patient back to the proximal station and acquiring high spatial resolution MR images of the arterial vasculature that may be used alone or can be combined with the low spatial resolution MR images previously acquired in the proximal station.

According to another aspect of the invention, a computer program is disclosed to control a medical imaging scanner. The computer program has instructions to control a computer to move a patient table through a plurality of scan stations that include at least one proximal station and at least one distal station. The patient table is initially positioned in the proximal station and MR data is rapidly acquired after administration of a contrast bolus. The computer program then causes the computer to control patient table movement and move the patient table to the distal station and acquire high resolution MR images therein. Afterward, the patient table is returned to the proximal station to acquire MR image data of a spatial higher resolution than that previously acquired.

The invention also includes an MRI apparatus having a number of gradient coils positioned about a bore of a magnet to impress a polarizing magnetic field, an RF transceiver system, and an RF modulator controlled by a pulse control module to transmit RF signals to an RF coil assembly in order to acquire MR images. The invention also includes a computer programmed to operate the MRI apparatus and after receipt of an indication of contrast bolus passage in a patient, causes the MRI apparatus to acquire low spatial resolution images in a first proximal station, track passage of the contrast bolus, and move a patient table in response thereto after each low resolution image acquisition until MR data is acquired for each proximal station. Then once the patient table is in a distal station, acquire a high resolution image therein. The computer is then programmed to move the patient table back to the first proximal station and acquire high spatial resolution images for each of the proximal stations.

An MR angiography examination is also disclosed that includes administering a contrast agent into a patient, then tracking passage of the contrast agent through the patient, and positioning the patient table such that an arterial structure in a distal portion of an extremity is within a field-of-view (FOV) of the MR scanner. The examination next includes acquiring high resolution images of the arterial structure in the distal portion of the extremity, and then moving the patient such that the remaining arterial structure is within the FOV of the MR scanner. MR images are then acquired of the remaining arterial structure.

The invention is particularly useful with intravascular contrast agents where leakage of the contrast from the vessels is much less than that with extra-cellular contrast agents. By imaging the distal arteries first during a peripheral MRA, using an intravascular contrast agent, sufficient preferential depiction of the distal arteries is achieved. In this manner, arterial visualization is significantly improved for the smaller distal vessels when using a blood pool agent for a multi-station examination.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings.

DETAILED DESCRIPTION

Figure 1:
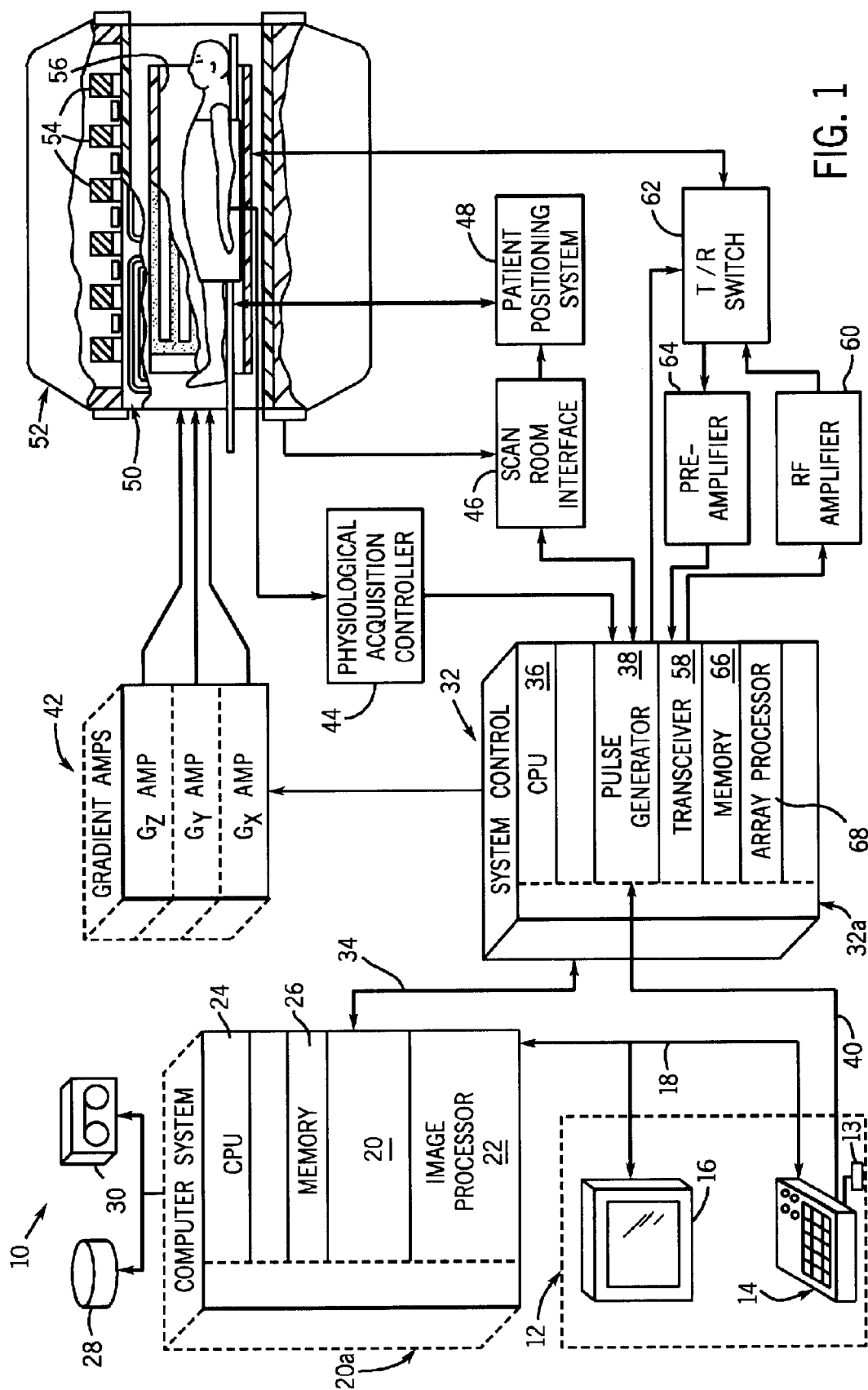
FIG. 1 is a schematic block diagram of an NMR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The MR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced MR system, or any similar or equivalent system for obtaining MR images so that optimal imaging of the peripheral vasculature in a multi-station examination can emphasize distal arterial visualization.

The invention includes the use of the aforementioned MRI system to track the passage of a contrast bolus through a patient while performing, or executing, the invention. FIGS. 2–5 describe the technique to acquire a series of MR images and tracking passage of the contrast bolus. In one embodiment, only a fraction of the total k-space data necessary to reconstruct a high spatial resolution image is acquired for the proximal stations. However, it is shown and set forth in FIG. 6 that the low spatial frequency data acquired for the proximal stations can itself be reconstructed to generate low spatial resolution images.

In general, the present invention includes a technique that calls for selecting the scan protocol for the proximal stations so as not to compromise temporal arterial segmentation image quality in the distal station. Data acquisition in the more proximal stations can precede with acquiring low spatial resolution images preferentially during the first pass of the contrast agent, but with no minimum acquisition time. Rather, as soon as passage of the contrast material is detected, the patient/patient table is moved automatically by computer control to the next station. This process is repeated until the final proximal station is reached, at which time a complete high resolution image acquisition can be preformed in the distal station(s). The table and patient are then moved back to the first proximal station and separate high spatial resolution MRA data sufficient to reconstruct an image are acquired. This process is repeated for each of the proximal stations.

Figure 2:
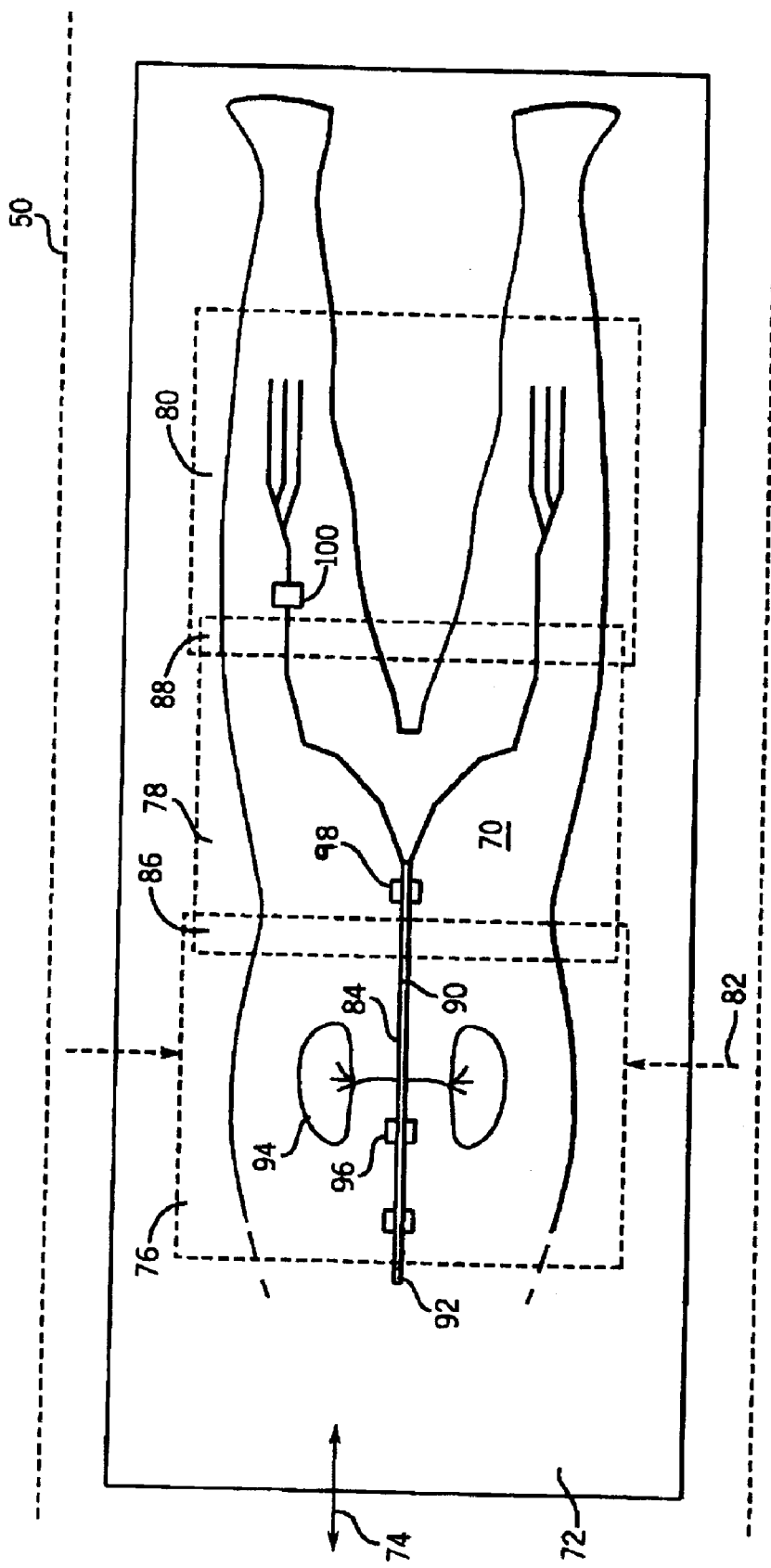
FIG. 2 is a schematic diagram illustrating an arrangement for conducting a peripheral MR angiography examination in accordance with the invention.

Referring to FIG. 2, a patient 70 is shown supported on a computer controlled, movable table 72, which may be slid or translated fore and aft as indicated by arrow 74 in the magnet of MR apparatus 10. Thus, patient 70 may be selectively positioned within the bore of main magnet 50. The motion of the table is under computer control whose position along axis 74 of the magnet bore can be precisely controlled and is reproducible.

More specifically, FIG. 2 shows patient 70 having a blood vessel 84 of substantial length, such as the aorta, femoral arteries, or other artery, extending from the abdominal area into the lower limbs of the subject. It is desirable to acquire MR image data of vessel 84 in its entirety. However, because of the substantial length of vessel 84, it is necessary to obtain the data by establishing a plurality of scan locations or stations 76, 78, 80 along the length of patient 70 and within components of the MR system. Each scan station 76, 78, 80 includes a predefined section of patient 70. For example, scan station 76 includes the upper trunk area of patient 70, scan station 78 includes the lower trunk area, and scan station 80 includes the lower extremities of patient 70. To acquire MR data associated with a particular scan station, movable table 72 is moved fore and aft along axis 74 to position the particular scan station in a specified relationship with the main magnet 50. For example, FIG. 2 shows the midpoint of scan station 76 positioned at isocenter 82 of magnet 50.

In a conventional arrangement, an entire set of MR data pertaining to the segment of vessel 84, lying within scan station 76, would be acquired while such scan station was in the position shown in FIG. 2. Then, table 72 would translate patient 70 leftward, as viewed in FIG. 2, to position the midpoint of scan station 78 at isocenter 72. After scanning an entire set of data pertaining to the segment of vessel 84 within scan station 78, patient 70 would be further translated, to position the midpoint of scan station 80 at isocenter 82. A set of MR data pertaining to scan station 80 would then be scanned to complete the data acquisition procedure. It is noted that a certain amount of over-lap 86, 88 may occur between adjacent scan stations. This is both desired and needed to enable the effective combination of images from each station into a single combined image covering the entire extent of the imaged region from all stations.

It is common practice in MR angiography to intravenously inject a contrast agent, such as 20–40 mL of Gd-chelate contrast agent, into the blood stream 90 flowing through vessel (abdominal aorta) 84 which provides a bolus 92 to flow through the blood stream 90. Since vessel 84 carries blood from the upper body to the lower limbs of patient 70, the flow direction is from left to right, as viewed in FIG. 2. After reaching the pulmonary system 96, the bolus 92 would arrive first at scan station 76, then arrive at scan station 78, and finally arrive at scan station 80.

In accordance with a conventional technique developed by the General Electric Company and known commercially as SMARTPREP™ and as described in detail in AUTOMATED DETECTION OF BOLUS ARRIVAL AND INITIATION OF DATA ACQUISITION IN FAST, THREE DIMENSIONAL, GADOLINIUM-ENHANCED MR ANGIOGRAPHY, by Foo T K L; Saranathan M; Prince M R; Chenevert T L, in *Radiology* 1997; 203:273–280 and U.S. Pat. No. 6,167,293, a monitor 96 is placed in close proximity to vessel 84 and upstream of the arterial blood flow for the field-of-view (FOV) that constitutes scan station 76, an example of which is shown in FIG. 2. The precise positioning of monitor 96 is not critical, but preferably, it is positioned within the first 25% of the relevant scan station. The monitor 96 periodically detects MR signal excited in a small volume or region of blood vessel 84. The detected MR signal will reach a specified threshold level when the contrast agent enters that portion or segment of the blood vessel 84 lying within scan station 76, at which time scanning of station 76 commences. When the scan is complete, the MR apparatus will sequentially proceed to acquire data from the subsequent scan stations 78 and 80.

As previously indicated, imaging time is dependent on the time required for the bolus 92 to travel from one scan station to the next. Since it varies from patient to patient, it would be advantageous to know such travel time in real-time. Thus, monitors 98 and 100 can be directed toward vessel 84 in scan stations 78 and 80. Monitors 98 and 100 can then detect the arrival of bolus 92 within scan stations 78 and 80, respectively. The operation and construction of monitors 98 and 100 is similar to that of monitor 96.

There are two main algorithms to complete a multi-station MR image acquisition. The first, as shown in FIG. 3, is a test bolus travel time determination algorithm 102, and the second, is the MR image acquisition 104, as shown in FIG. 4, using the test bolus travel timing determination of FIG. 3.

Figure 3:
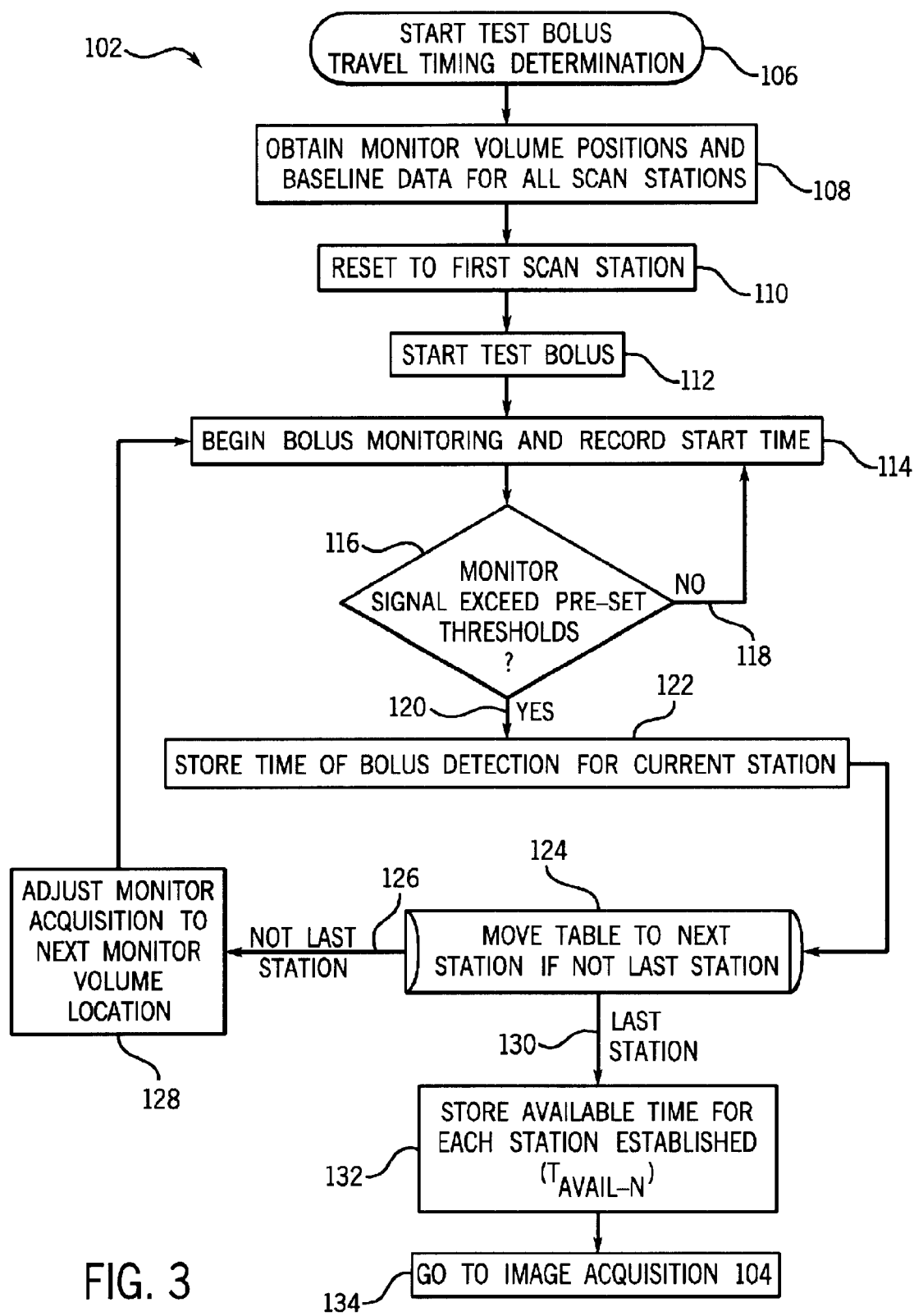
FIG. 3 is a flow chart to implement the peripheral MR angiography examination.

Referring to FIG. 3, the first step in the test bolus travel timing determination algorithm 102 after startup 106 is to obtain monitor volume positions and baseline data for all scan stations 108. Baseline data is obtained from each monitor prior to acquisition of image data of the angiography exam in the absence of contrast agent. From such data, a threshold level may be reset for each monitor to indicate arrival of the bolus at the corresponding scan stations. These localized scans are typically referred to as scout views. The system is then reset to the first scan station and the test bolus is started 112 by injecting a small amount of contrast agent, typically 1–5 ml, injected at the same flow rate as a regular exam bolus. The test bolus begins to pass through the patient's peripheral vasculature as the algorithm records the start time and begins bolus monitoring 114. It is noted that the monitor volume 96, 98, and 100 can be located anywhere within the image field-of-view within each station, and preferably, can be placed exactly over the area of interest within the desired field-of-view. The MR signal monitored is compared against a preset threshold 116, and if the monitored signal does not exceed the preset threshold 118, the start time is reset and bolus monitoring begins over again at 114. When the monitored signal exceeds the preset threshold 120, the time at which the bolus is detected for that scan station is stored 122. The patient table is moved to a next, or subsequent, scan station as long as the current scan station is not the last predefined scan station 124, 126. The monitor volume is then adjusted to acquire data at the next monitor volume location 128, at which time the system returns to begin bolus monitoring and recording the start time of that particular monitor volume at 114, and then continues to loop and acquire the travel time of the test bolus through each of the given number of scan stations until the last scan station is detected at 124, 130. The time available for acquiring imaging at a regular exam bolus, is then stored for each station as $T_{avail}$ at 132 and the system is then ready for regular MR image acquisition 134.

Figure 4:
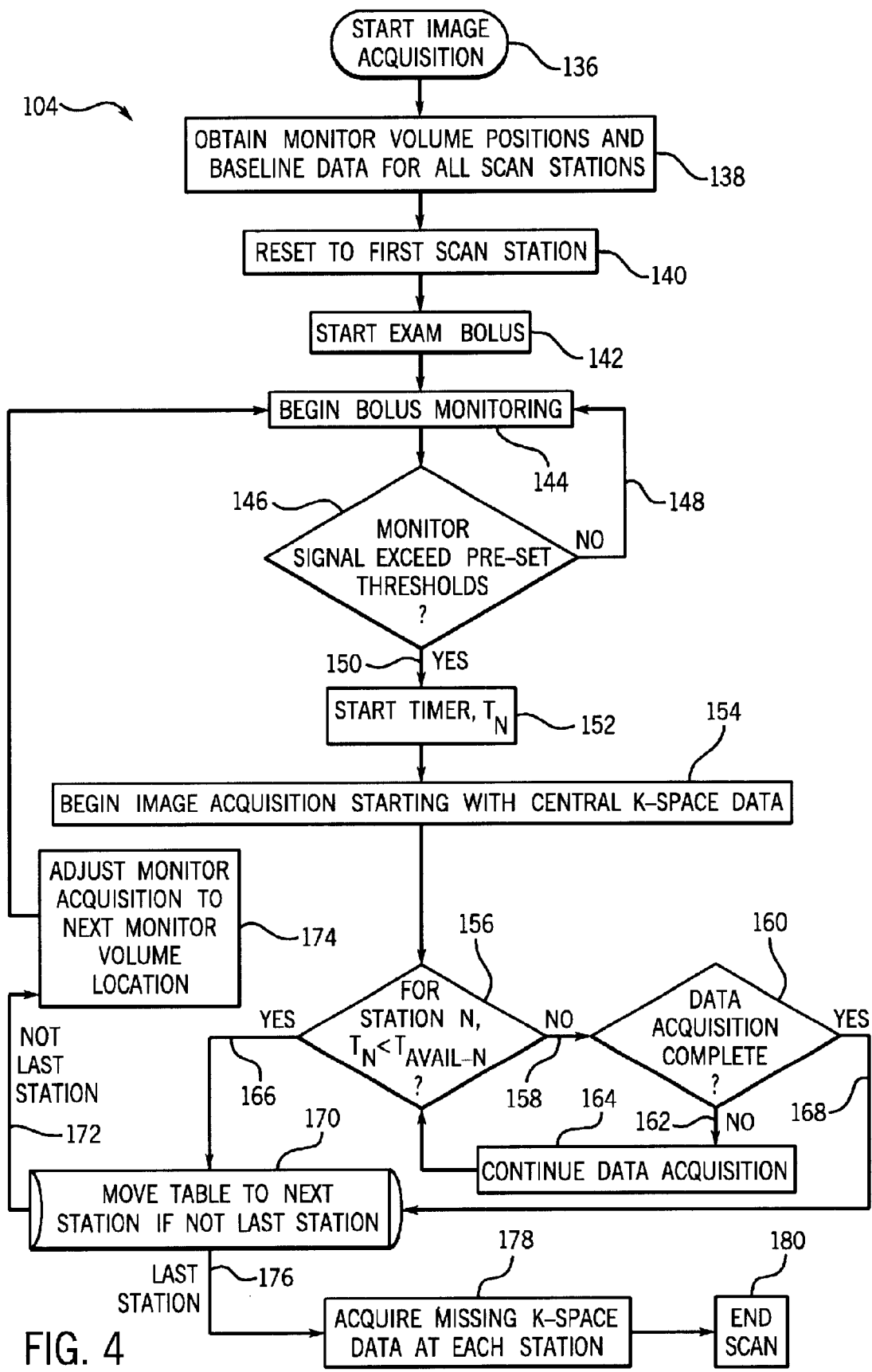
FIG. 4 is a flow chart illustrating another aspect of the peripheral MR angiography examination.

Referring to FIG. 4, an image acquisition algorithm 104 is shown, and after initialization 136, the monitor volume positions and baseline data for all scan stations are acquired 138. The system is then reset and the patient table is moved back to the first scan station 140 and the regular exam bolus is injected into the patient 142. Bolus monitoring is then commenced 144 while monitoring the monitor volume for the first scan station. The monitored signal is compared against the preset threshold 146, and if it does not exceed the preset threshold 148, the monitor rechecks for the presence of the bolus 144 until the monitored signal exceeds the preset threshold 150, at which time, the timer ($t_n$) is activated 152 and the MR apparatus begins image acquisition 154, starting primarily with the acquisition of central k-space data. The timer for that particular station is then compared to the test bolus travel time 156, and as long as the current data acquisition time is less than the test bolus travel time 158, and if data acquisition is not yet complete 160, 162, the system continues to acquire data 164. Once either the data acquisition time for this particular scan station equals or exceeds the test bolus travel time 156, 166, or the system has acquired sufficient data 160, 168, the patient table is adjusted to the next scan station as long as the system is not currently at the last scan station 170, 172. After which, the system switches to acquire data at the next monitor volume location 174 and begins the bolus monitoring again at 144. The system then loops, as described, until data is acquired or the system times out for the last scan station 176. The system then returns to any scan station in which a full k-space data set had not been acquired, and acquires the missing k-space data 178. Once all k-space data is acquired for all the scan stations, the image acquisition algorithm is concluded 180.

While FIG. 2 shows three scan stations 76, 78 and 80, it is readily apparent that in other embodiments, the number of scan stations n may be greater or less than that shown in this embodiment. Moreover, as is readily apparent from FIG. 4, the initial data acquisition at each scan station is described as acquiring central k-space data, that is, the k-space data of low spatial frequencies. This acquisition can be expanded to acquire higher spatial frequency k-space data if time permits. However, it is recognized that in a preferred embodiment of the present invention, initially complete low resolution images are acquired, as will be further described hereinafter.

Figure 5:
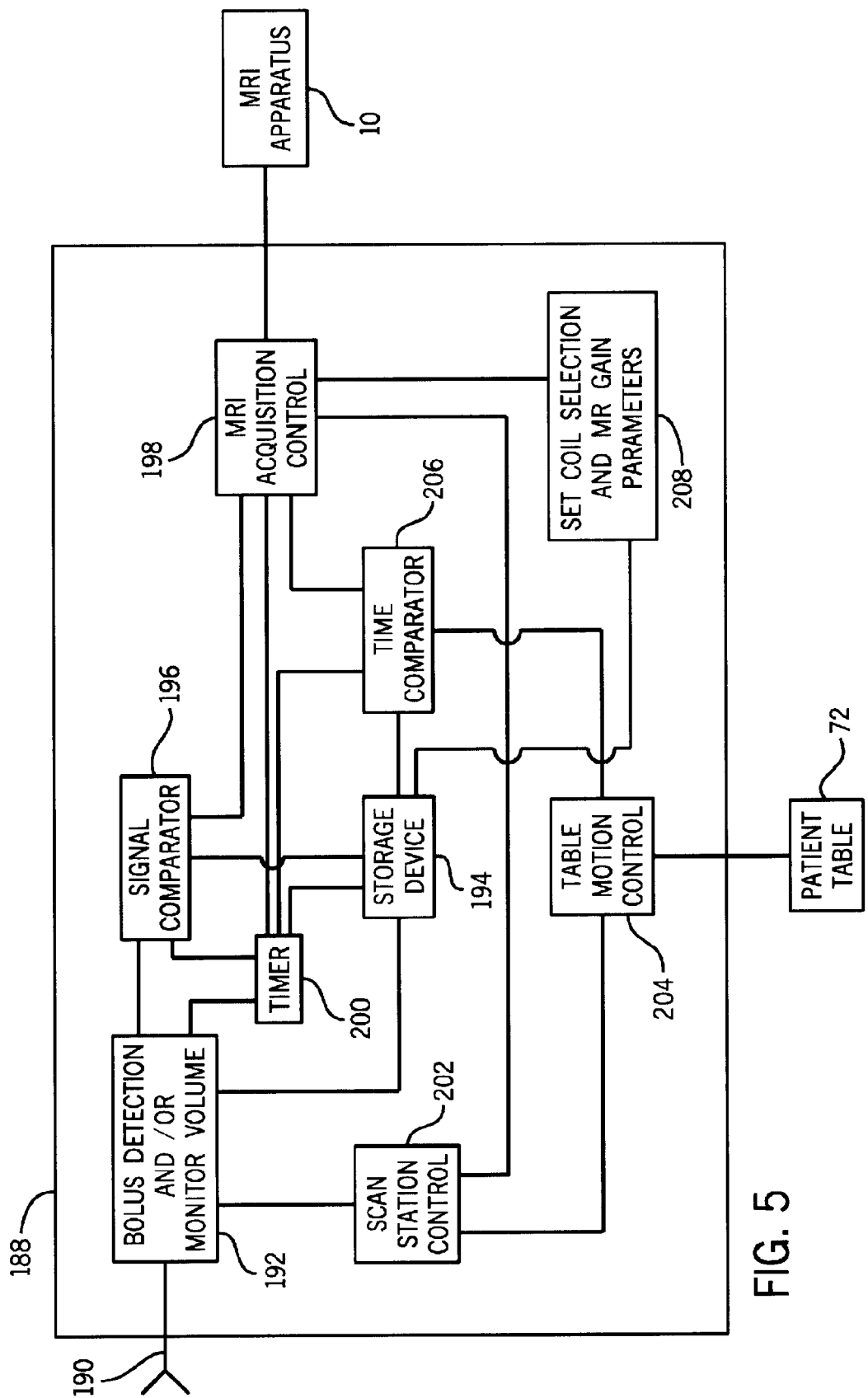
FIG. 5 is a block diagram of an embodiment of the invention.

FIG. 5 shows a functional block diagram of computer 188 connected to MRI apparatus 10, as shown in FIG. 1, and to the movable patient table 72. The control has an input 190 that may be used for indicating the start of a test bolus and/or the exam bolus to the bolus detection 192. Additionally, or alternatively, bolus detection can be accomplished by the aforementioned monitor volume procedure, one example of which is the aforementioned commercially available SMARTPREP™ from the General Electric Company. The storage device 194 is connected to the bolus detection 192 and receives preset thresholds for comparing the monitored signal from the monitor volume. The preset thresholds are compared to the monitored signals in a signal comparator 196, the output of which is used in an MRI acquisition control 198, together with the output of a timer 200, to check the location of the bolus using MRI apparatus 10. The MRI acquisition control 198 also is connected to a scan station control 202 which controls patient table 72 through table motion control 204. The scan station control 202 is also connected to the bolus detection 192 in order to reset the patient table to the first scan station when a procedure is first initialized. Timer 200 is also connected to storage device 194 to store the maximum travel time that it takes the test bolus to travel through a given scan station. Timer 200 is also connected between a signal compared to 196 and the MRI acquisition control 198 and is used during image acquisition to time the current MRI acquisition and compare it in time comparator 206 with the maximum test bolus travel time as retrieved from the storage device 194. To optimize image acquisition, the stored values for the test bolus travel time, for each scan station, are used in the MRI acquisition control 198 to select the most desirable coil elements in MRI apparatus 10 and to set the optimal receiver and body coil transmitter gain parameters in MRI apparatus 10.

It is understood that the aforementioned technique is but one particular method for tracking the contrast agent through the patient. Other techniques could be used as well, such as interleaving an advance scan of the next scan station with the acquisition of data in the previous scan station to watch for and track the arrival of the contrast bolus.

Figure 6:
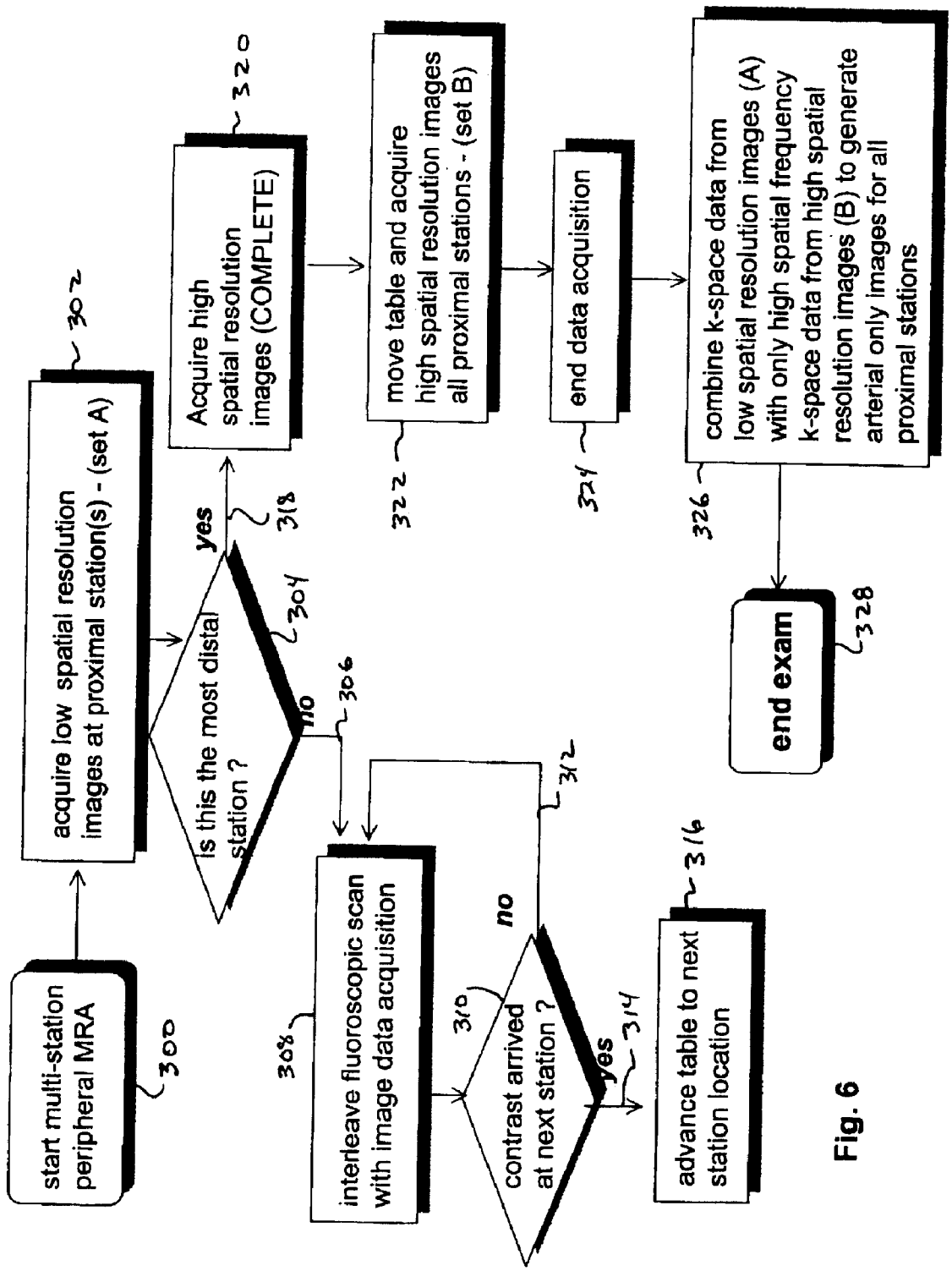
FIG. 6 is a flow chart showing the techniques of the present invention.

Referring now to FIG. 6, the technique of the present invention is described in flow chart form. The multi-station peripheral MRA begins 300 with administering a contrast agent into a blood stream of a patient and then acquiring a first data set A sufficient to reconstruct low spatial resolution images of an arterial vasculature of the patient while positioned in a first proximal station 302. The system then checks to see if the current station is the most distal station 304, and if it is not 306, it begins the process of moving the patient on the patient table from one proximal station to the next and simultaneously tracking the passage of the contrast agent through the patient 308. In a preferred embodiment, this is accomplished by interleaving a fluoroscopic scan with the image data acquisition. If the contrast has not arrived at the next station 310, 312, the system continues to track the passage of the contrast agent and acquire data in the last station 308. Once the contrast bolus has arrived in the next station 310, 314, the patient table is advanced to the next station 316 where a new set of low spatial resolution images are acquired 302. The system continues to acquire low spatial resolution images for as many proximal stations that have been predefined. Once the contrast agent has reached the most distal station and the table has been advanced to that station 304, 318, the system continues to acquire data in the distal station until a complete data acquisition for high spatial resolution images has been accomplished 320. The patient and the patient table are then moved back to the first proximal station where the high spatial resolution image is acquired 322. The system then interleaves table movement and acquires high spatial resolution images for each of these proximal stations until all high spatial resolution images have been acquired at 324. It is noted that the high spatial resolution images at the proximal stations 322 includes signal from both arterial structures, while the low spatial resolution images acquired during the first pass or arterial phase 302 contains signal from preferentially arterial vascular structures only.

Although the assessment of the degree of vascular stenosis can be made from the high spatial resolution images 322 using the low spatial resolution images 302 to identify regions of possible vascular stenosis, new images can be generated by combining data from 302 and 322 at 326.

It is known that the spatial resolution of MR images is determined by the maximum k-space spatial frequency that is sampled. For low spatial resolution images, this maximum spatial frequency ($k_{max,low}$) is less than that for high spatial resolution images ($k_{max,high}$). The data from 302 (preferentially of arterial structures) and 322 (preferentially of both arterial and venous structures) can be combined to generate images that can be either high spatial resolution of arterial or venous only structures.

To generate images with higher spatial resolution than in 302, but maintaining a preference of depicting arterial vascular structures only, the data from 302, i.e., for spatial frequencies $|k|=0, \ldots, k_{max,low}$, can be combined with data from 322 at 326 using the spatial frequencies $|k|=k_{max,low}, \ldots, k_{max,high}$, such that a higher spatial resolution image than 302 can be generated while maintaining a preference for depicting arterial vascular structures only. Conversely, a high spatial resolution image preferential depiction of arterial structures can be generated by subtracting the images obtained from 326 from 322.

By imaging the distal arteries first during the peripheral MRA examination, sufficient preferential depiction of the distal arteries is achieved. The subsequent high spatial resolution imaging of the proximal larger vessels during the later delayed or equilibrium phase can be combined with the previously acquired low spatial resolution data acquired during the initial arterial phase pass. The venous contamination acquired during the late delayed or equilibrium phase can be removed by segmentation of the arteries from the veins using image processing. That is, the data from the initial pass and the later acquisitions can be combined to achieve arterial-venous segmentation. Since the data from the initial pass contains signal only from the arterial structures and the second set of data is high spatial resolution data containing signal from both arterial and venous structures. Arterial-venous signal segmentation can be achieved by combining the low spatial frequency information from the first pass and the high spatial frequency information from the second, later pass. Since the same low spatial frequency information is acquired in both cases, phase correction can be performed to spatially register data from the two acquisitions by the use of phase correction of the raw k-space data, or by applying a smoothing function at the transition boundaries of the combined data space in order to minimize image blurring artifacts.

It is noted that the technique of the present invention is applicable for any lengthy vascular territory. It is particularly applicable for the arteries below the knee and the arteries below the elbow since these arteries are typically difficult to image because such arteries run parallel to their venous counterparts, and are relatively small and located close to the venous structure in these areas. In addition, by using temporal segmentation for imaging the smaller distal vessels, bolus delivery and imaging can be optimized with injection rates greater than 1 mL/sec. within the context of a comprehensive multi-station peripheral MRA examination.

This approach emphasizes the arterial phase acquisition of image data in the most distal station first to improve the arterial visualization of the smaller distal vessels for a contrast-enhanced multi-station MRA examination. This results in a more time efficient method for illustrating an arterial tree which covers more than a single FOV. The low spatial resolution images acquired in the proximal stations are acquired preferentially during the first pass of the contrast agent, and only as much spatial resolution in these stations is acquired in order to avoid compromising image quality of the most distal station(s). It is noted that no minimum amount of k-space data is acquired, and no minimum time for acquisition is imposed in the more proximal stations, as data for complete images are acquired in all stations and at all times. By later acquiring the high spatial resolution images during the later delayed or equilibrium phase in the proximal stations, k-space data from the low spatial resolution first pass and the high spatial resolution second pass can be combined to generate images of preferentially arterial structures. Image blurring artifacts are minimized by phase correction of the first pass low spatial frequency data using the phase of the low spatial frequency data of the second pass as a reference.

Therefore, a method of peripheral vascular imaging, in accordance with the present invention, includes administering a contrast agent into a blood stream of a patient, and then acquiring low spatial resolution MR images of an arterial vasculature of the patient when positioned in a proximal station, and then moving the patient from the proximal station to a distal station. The method includes acquiring MR data of an extremity of the patient at the distal station sufficient to reconstruct an image to visualize arterial structure, and then moving the patient back to the proximal station to acquire high spatial resolution MR data of the arterial structures in the proximal stations.

Preferably, a fluoroscopic scan is interleaved with MR data acquisition to automatically move the patient table with the passage of the contrast agent, and the low and high spatial frequency data sets are combined to reconstruct an image of the arterial vasculature. As is evident, such an arterial MRA examination makes acquisition of MR data at the distal station the primary target, and acquisition of MR data at the proximal stations, a secondary target. The present invention contemplates a plurality of proximal stations and at least one distal station, but the distal station can also be divided into a plurality of distal stations. The invention is readily applicable to any lengthy vascular territory, but is particularly useful in the arterial structure of the extremities.

The present invention is incorporated into a computer program to control a medical image scanner. The computer program has a set of instructions to control a computer, as previously described, to move the patient table through a plurality of scan stations to include at least one proximal station and at least one distal station, and then position the patient table in the at least one proximal station. The computer program then causes the computer to control the medical imaging scanner to rapidly acquire MR data in the proximal station after administration of a contrast bolus, move the patient table to the distal station, and after acquisition of a high resolution image in the distal station, return the patient table to the proximal station where higher resolution MR data can be acquired.

The computer program has further instructions to track movement of the contrast bolus through the patient and periodically move the patient table and acquire MR data so as to chase the contrast bolus. Acquisition time for MR data acquisition in the proximal station is set on-the-fly based on the passage of the contrast bolus such that MR data acquisition is optimized in the distal station at the expense of the rapid acquisition of MR data in the proximal station.

The described technique is ideally suited for contrast agents which provide reliable and prolonged high arterial signal such as an intravascular contrast agent. Persistent high arterial signal will afford higher quality high spatial resolution MR data during the late delayed or equilibrium phase, and the system can then combine the low and high spatial resolution data to form a combined data space and reconstruct an MR image of the peripheral vasculature. The computer can segment out arterial structure from venous structure in the rapidly acquired MR data using low spatial data derived from the later acquired high resolution MR data. The segmentation can be performed by either phase correction of raw k-space data, or the application of a smoothing function at the transition boundaries of the combined data space to minimize image blurring artifacts.

The invention includes an MRI apparatus that includes an MRI system such as that described with reference to FIG. 1. A computer is programmed to receive an indication of contrast bolus passage in a patient and acquire a low resolution image in a first proximal station, then track passage of the contrast bolus and move the patient table in response thereto after each low resolution image acquisition until MR data is acquired for each proximal station. Once the table is moved to the distal station, a high resolution image is immediately acquired, and once complete, the patient table is moved back to the first proximal station. The table is moved through each of the proximal stations wherein high resolution data is acquired. The computer can also be programmed to combine the low and high resolution data for each proximal station to generate arterial-only images for all the proximal stations.

The invention also includes an MRA examination that includes administering a contrast agent into a patient, tracking passage of the contrast agent through the patient, and positioning the patient such that an arterial structure in a distal portion of an extremity is within an FOV of an MRI scanner. The examination includes acquiring high resolution image data of the arterial structure in the distal portion of the extremity, and then moving the patient such that a remaining arterial structure is within the FOV of the MRI scanner to acquire MR data of the remaining arterial structure.

Additionally, this MRA examination can include separating arterial and venous structure from the MR data acquired in post-processing. Preferably, the MRA examination includes acquiring low spatial resolution images in the proximal stations before positioning the patient such that the distal portion of the extremity is in the FOV, and periodically moving the patient through each proximal station. Once in the distal station, high resolution images are immediately acquired. By using the intravascular contrast agent, the low spatial resolution images can be combined with the later acquired data to reconstruct an arterial-only image of the peripheral vasculature.

The invention can also be performed using a method of peripheral vasculature imaging that includes first administering a contrast agent into a blood stream of a patient, then acquiring low spatial frequency MR data of an arterial vasculature of the patient when positioned in a proximal station, and then moving the patient from the proximal station to a distal station. MR data of an extremity of the patient is then acquired at the distal station that is sufficient to reconstruct an image to visualize arterial structure in the extremity of the patient. The method next includes moving the patient back to the proximal station and acquiring the remaining high spatial frequency MR data of the arterial vasculature to combine with the low spatial frequency data to reconstruct images from the proximal station.

Alternatively, and as previously described, another embodiment is to acquire complete data sets necessary to reconstruct an image at all stations. In order to ensure that the arterial structure depiction is optimal at the more distal station, images at the more proximal stations are acquired with lower spatial resolution, while that of the most distal station are acquired with higher spatial resolution. For low spatial resolution images, the voxel sizes are much larger and complex flow patterns characteristic of vascular stenosis would be over-emphasized in such images. This phenomenon is well noted in the field of vascular MR angiography, where it known that images acquired with low spatial resolution result in an overestimation of the stenosis. The proposed technique turns this phenomenon into an advantage.

By using low spatial resolution images at the more proximal stations, this serves as a screen where the sensitivity to vascular stenosis is increased. This allows images at the more proximal stations to be acquired in a shorter time than higher spatial resolution images, permitting data for the most distal station to be acquired before significant venous signal contamination is obtained. The images for the more proximal station will have minimal venous contamination due to the shorter acquisition time. A more accurate assessment of the degree of vascular stenosis can be achieved by revisiting the more proximal stations and acquiring images of sufficient spatial resolution necessary to render an accurate assessment of the degree of vascular stenosis. This task is made easier by the fact that the first, arterial-phase low spatial resolution images will have already targeted the regions of possible vascular stenosis.

It is also possible to combine different parts of the k-space data to generate new images. As an example, the complete low spatial resolution data acquired during the first pass or arterial phase of the contrast bolus can be combined with the higher spatial frequency data of the delayed acquisition to generate an image with emphasis on the arterial structure depiction but with higher spatial resolution. Data can also be combined in different manner to generate images of preferentially venous structures.

The present invention has been described in terms of the preferred embodiment, and it is recognized that equivalents, alternatives, and modifications, aside from those expressly stated, are possible and within the scope of the appending claims.

What is claimed is:

1. A method of peripheral vasculature imaging comprising:

administering a contrast agent into a blood stream of a patient;

acquiring low spatial resolution MR images of an arterial vasculature from the patient when positioned in a proximal station;

moving the patient from the proximal station to a distal station;

acquiring MR data of an extremity of the patient at the distal station sufficient to reconstruct a high spatial resolution image of arterial structure in the extremity of the patient;

moving the patient back to the proximal station; and acquiring high spatial resolution MR images of the arterial vasculature in the proximal station.

2. The method of claim 1 further comprising combining the low and high spatial frequency MR k-space data from the low and high spatial resolution MR images to reconstruct high spatial resolution images of the arterial vasculature.

3. The method of claim 1 further comprising interleaving a fluoroscopic scan with MR data acquisition to automatically move the patient table with passage of the contrast agent.

4. The method of claim 1 wherein the contrast agent is an intravascular contrast agent.

5. The method of claim 1 further comprising performing an arterial MRA exam in which acquisition of MR data at the distal station is a primary target and acquisition of MR data at the proximal station is a secondary target.

6. The method of claim 1 wherein acquisition of MR data occurs at a plurality of distal stations and a plurality of proximal stations.

7. The method of claim 1 applied to a lengthy vascular territory.

8. The method of claim 7 wherein the lengthy vascular territory is one of a lower extremity arterial structure and an upper extremity arterial structure.

9. The method of claim 1 wherein the step of acquiring low spatial resolution MR images has no minimum acquisition time but has an acquisition time dependent on passage of the contrast agent.

10. The method of claim 9 further comprising tracking the passage of the contrast bolus and moving the patient in response thereto.

11. A computer program to control a medical imaging scanner, the computer program having instructions to control a computer to:
move a patient table through a plurality of scan stations to include at least one proximal station and at least one distal station;
position the patient table in the at least one proximal station;
rapidly acquire MR data in the at least one proximal station after administration of a contrast bolus sufficient to reconstruct a low resolution MR image;
move the patient table to the at least one distal station;
acquire MR data in the at least one distal station sufficient to reconstruct a high resolution image;
return the patient table to the at least one proximal station; and
acquire higher spatial resolution MR images than that acquired rapidly in the at least one proximal station.

12. The computer program of claim 11 wherein the high resolution MR data is acquired during an arrival of the contrast bolus for optimal imaging of peripheral vasculature in the distal station.

13. The computer program of claim 11 having further instructions to:
track movement of the contrast bolus through the patient; and
periodically move the patient table and acquire MR data so as to clear the contrast bolus.

14. The computer program of claim 11 wherein the rapidly acquired MR data at the at least one proximal station includes acquisition of low spatial resolution images and wherein the low spatial resolution image k-space data is combined with high spatial frequency k-space data of the higher spatial resolution images to reconstruct MR images of a peripheral vasculature of the patient having high spatial resolution and preferentially of arterial-only vasculatures.

15. The computer program of claim 11 having further instructions to set an acquisition time for MR data acquisition in the at least one proximal station on-the-fly based on passage of the contrast bolus such that MR data acquisition is optimized in the at least one distal station at the expense of the rapidly acquired MR data in the at least one proximal station.

16. The computer program of claim 11 having further instructions to combine the rapidly acquired MR data with selected portions of higher spatial resolution k-space data from the at least one proximal station to form a combined data space and reconstruct an MR image of a peripheral vasculature.

17. The computer program of claim 16 having further instructions to segment out arterial structure from venous structure in the rapidly acquired MR data using low spatial frequency data derived from the later acquired higher spatial resolution MR images.

18. The computer program of claim 17 wherein the segmentation is performed by one of:
phase correction of raw k-space data; and
application of a smoothing function at transition boundaries of the combined data space to minimize image blurring artifacts.

19. The computer program of claim 11 wherein the contrast bolus includes an intravascular contrast agent.

20. A method of MRA examination comprising:
administering a contrast agent into a patient;
tracking passage of the contrast agent through the patient;
positioning the patient such that an arterial structure in a distal portion of an extremity is within a FOV of an MR scanner;
acquiring high resolution images of the arterial structure in the distal portion of the extremity;
moving the patient such that a remaining arterial structure is within the FOV of the MR scanner; and
acquiring MR images of the remaining arterial structure.

21. The MRA examination of claim 20 further comprising separating arterial and venous structure from the MR data acquired from the remaining arterial structure in post-processing.

22. The MRA examination of claim 20 further comprising:
acquiring low spatial resolution MR images of an arterial vasculature from the patient when positioned in a proximal station before positioning the patient such that an arterial structure in a distal portion of an extremity is within a FOV of an MR scanner;
moving the patient from the proximal station to a distal station before acquiring another high spatial resolution image; and
combining k-space data from the low spatial resolution MR images with high spatial frequency k-space data of the high spatial resolution MR images.

23. The MRA examination of claim 20 wherein the contrast agent is an intravascular contrast agent.

24. An MRI apparatus to acquire MRA images comprising:
a magnetic resonance imaging (MRI) system having a plurality of gradient coils positioned about a bore of a magnet to impress a polarizing magnetic field and an RE transceiver system and an RF switch controlled by a pulse moduic to transmit RF signals to an RF coil assembly to acquire MR images; and
a computer programmed to:
receive an indication of contrast bolus passage in a patient;
acquire a low spatial resolution image data set in a first proximal station;
track passage of the contrast bolus and move a patient table to a next proximal station in response thereto, and acquire another low spatial resolution image data set until the contrast bolus reaches a distal station;
acquire a high spatial resolution image data set in the distal station; and
move the patient table and acquire a high spatial resolution image data set for each of the proximal stations.

25. The MRI apparatus of claim 24 wherein the computer program is further programmed to:

move the patient table back to the first proximal station; and acquire high spatial resolution image data set in each proximal station for which low spatial resolution image data sets were acquired.

26. The MRI apparatus of claim 25 wherein the computer program is further programmed to combine low and high spatial frequency k-space data for each proximal station to generate arterial-only images for all proximal stations having high spatial resolution.

27. The MRI apparatus of claim 24 wherein the computer program is further programmed to interleave a fluoroscopic scan with image data acquisition to automatically track contrast bolus passage and move the patient table in response thereto.

* * * * *

UNITED STATES PATENT AND TRADEMARK OFFICE
CERTIFICATE OF CORRECTION

PATENT NO.    : 6,580,937 B2
DATED         : June 17, 2003
INVENTOR(S)   : Ho et al.

It is certified that error appears in the above-identified patent and that said Letters Patent is hereby corrected as shown below:

<u>Title page, Item [54] and Column 1, lines 1-5,</u>
Title, should read: -- METHOD AND APPARATUS FOR OPTIMAL IMAGING OF THE PERIPHERAL VASCULATURE EMPHASIZING DISTAL ARTERIAL VISUALIZATION IN A MULTI-STATION EXAMINATION --

Signed and Sealed this

Second Day of March, 2004

JON W. DUDAS
*Acting Director of the United States Patent and Trademark Office*